(12) United States Patent
Stumpf et al.

(10) Patent No.: US 11,086,370 B2
(45) Date of Patent: Aug. 10, 2021

(54) ACTIVITY-LIGHT-BASED PARAMETER REPORTING SYSTEM

(71) Applicant: Dell Products L.P., Round Rock, TX (US)

(72) Inventors: Michael Joseph Stumpf, Cedar Park, TX (US); Robert G. Bassman, The Hills, TX (US)

(73) Assignee: Dell Products L.P., Round Rock, TX (US)

( * ) Notice: Subject to any disclaimer, the term of this patent is extended or adjusted under 35 U.S.C. 154(b) by 335 days.

(21) Appl. No.: 16/179,397

(22) Filed: Nov. 2, 2018

(65) Prior Publication Data
US 2020/0142457 A1    May 7, 2020

(51) Int. Cl.
*G06F 1/20* (2006.01)
*G06F 11/30* (2006.01)
*H05K 7/20* (2006.01)

(52) U.S. Cl.
CPC .......... *G06F 1/206* (2013.01); *G06F 11/3058* (2013.01); *H05K 7/20209* (2013.01); *H05K 7/20836* (2013.01)

(58) Field of Classification Search
CPC ........ G06F 1/206; G06F 11/3058; G06F 1/20; H05K 7/20209; H05K 7/20836
See application file for complete search history.

(56) References Cited

U.S. PATENT DOCUMENTS

| | | | |
|---|---|---|---|
| 2009/0160344 A1* | 6/2009 | Hsu | F21V 29/677 315/117 |
| 2016/0062421 A1* | 3/2016 | Sugawara | G05B 15/02 700/299 |
| 2017/0117053 A1* | 4/2017 | Sharon | G11C 16/3418 |
| 2018/0052061 A1* | 2/2018 | Gilbert | B64D 45/00 |
| 2018/0109216 A1* | 4/2018 | Schultz | F01K 13/02 |

* cited by examiner

*Primary Examiner* — Mohamed Charioui
(74) *Attorney, Agent, or Firm* — Haynes and Boone, LLP

(57) ABSTRACT

An activity-light-based parameter reporting system includes a storage device that is coupled to a storage device activity light. The storage device includes a parameter reporting engine that monitors a parameter associated with the storage device, and determines whether a rate of change of the parameter has exceeded a reporting rate of change. In response to determining that the rate of change of the parameter has exceeded the reporting rate of change, the parameter reporting engine drives the storage device activity light via at least one activity light parameter reporting signal that is configured to report the parameter. A controller monitors the driving of the storage device activity light by the parameter reporting engine, and identifies a parameter value of the parameter via the at least one activity light parameter reporting signal used by the parameter reporting engine to drive the storage device activity light.

20 Claims, 10 Drawing Sheets

ACTIVITY-LIGHT-BASED PARAMETER REPORTING SYSTEM

BACKGROUND

The present disclosure relates generally to information handling systems, and more particularly to reporting parameters for components in an information handling system using the activity lights associated with those components.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, typically include a variety of components that may be configured to report a variety of component parameters that may be generated during the operation of those components. For example, storage devices in a server device may be configured to report their temperatures to a thermal controller and/or other thermal system components, which may then utilize those reported temperatures to control a cooling system in the server device (e.g., in order to provide cooling for the storage devices). Storage devices have been developed that are configured to report their temperatures (and other non-activity parameters) to the thermal controller by pulsing their storage device activity light, with the thermal controller monitoring the voltage provided to the storage device activity lights and decoding the pulses to identify temperatures being reported by the storage devices. For example, U.S. Pat. No. 10,055,127, assigned to the Assignee of the present disclosure, describes such a system. Such systems provide several benefits, including the ability to report temperature and other non-activity parameters outside of data paths and via "piggybacking" on top of the activity reports provided via the storage device activity light, but have also been found by the inventors of the present disclosure to suffer from a number of issues.

For example, temperature reporting by storage devices via their storage device activity lights produces a visual side effect that has been found to cause concern in users. Such activity-light-based temperature reporting functionality is relatively new and has not been seen by many users previously, and thus its occurrence (or lack thereof) can cause user concern, with some users fearing that the mechanism may be used to optically capture sensitive data. Furthermore, the repeated pulsing of storage device activity lights has been found to be aesthetically unpleasing to many users, particularly in racks that may include many storage devices, resulting in "messy" activity light behavior that is visible via the front of the rack. In an effort to address these issues, the temperature reporting rates of storage devices may be set relatively low in order to reduce the pulsing of the storage device activity lights while still attempting to provide for the reporting of accurate thermal statuses of the storage devices to the thermal controller. Currently, minimal accurate storage device thermal status require that Hard Disk Drive (HDD) storage devices report their temperatures at a rate of every 300 seconds, Solid State Drive (SSD) storage devices report their temperatures at a rate of every 5 seconds, and hybrid storage devices (e.g., HDD storage devices with an SSD storage device cache) report their temperatures at a rate somewhere in between that of HDD storage devices and SSD storage devices. Some device manufacturers have attempted to standardize a static 30 second temperature reporting rate, which as discussed above is insufficient to identify an accurate thermal status for an SSD storage device, much less to identify accurate thermal statuses of hybrid storage devices or heat/laser assisted magnetic recording storage devices that are in development and that may require faster temperature reporting rates and/or variable temperature reporting rates. As such, a trade-off is made between accurately reporting the thermal status of storage devices via pulsed storage device activity lights, and concerning users with the visual artifacts that result from doing so.

Accordingly, it would be desirable to provide an improved activity-light-based parameter reporting system.

SUMMARY

According to one embodiment, an Information Handling System (IHS) includes a processing system; and a memory system that is coupled to the processing system and that includes instructions that, when executed by the processing system, cause the processing system to provide a parameter reporting engine that is configured to: monitor a parameter associated with a component; determine whether a rate of change of the parameter has exceeded a reporting rate of change; and drive, in response to determining that the rate of change of the parameter has exceeded the reporting rate of change, a component activity light via at least one activity light parameter reporting signal that is configured to report the parameter.

BRIEF DESCRIPTION OF THE DRAWINGS

FIG. 5B is a graph view illustrating an embodiment of the rate of change of the temperature of the storage device of FIG. 5a.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
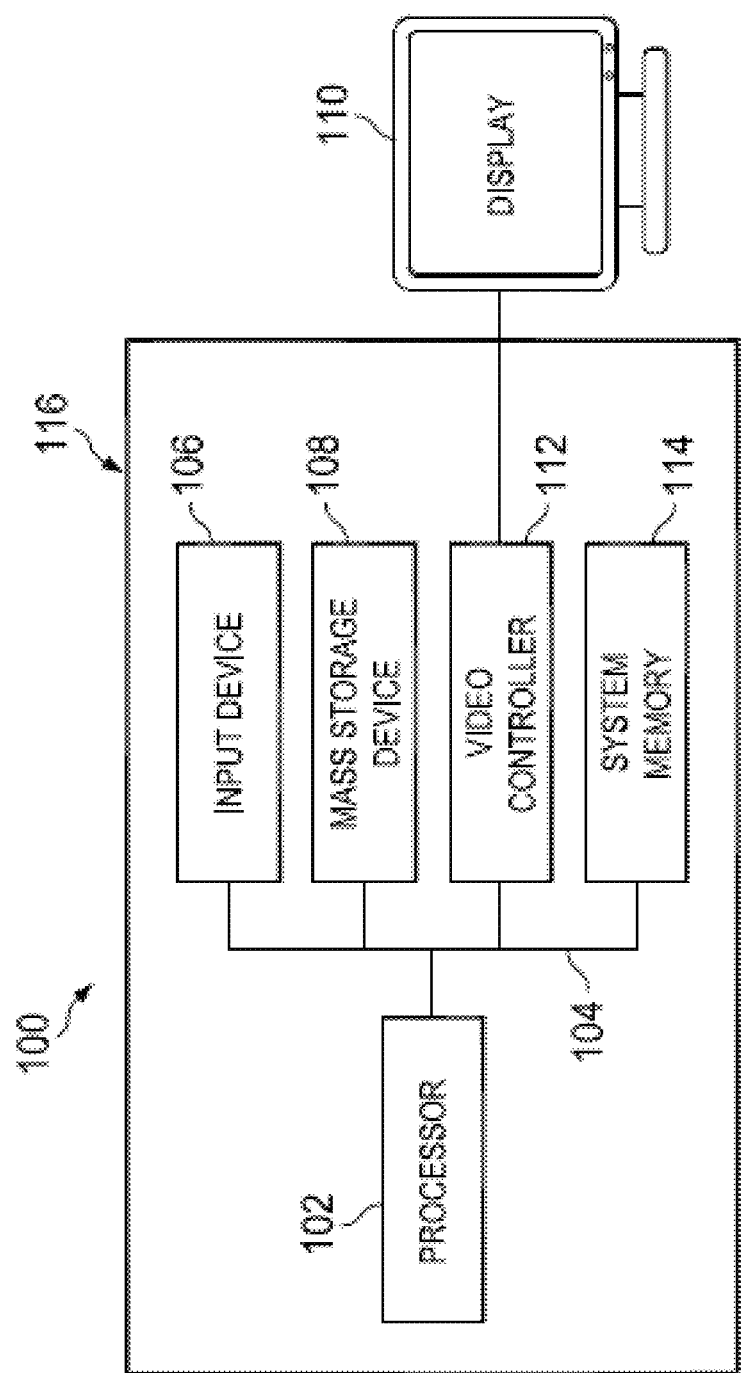
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
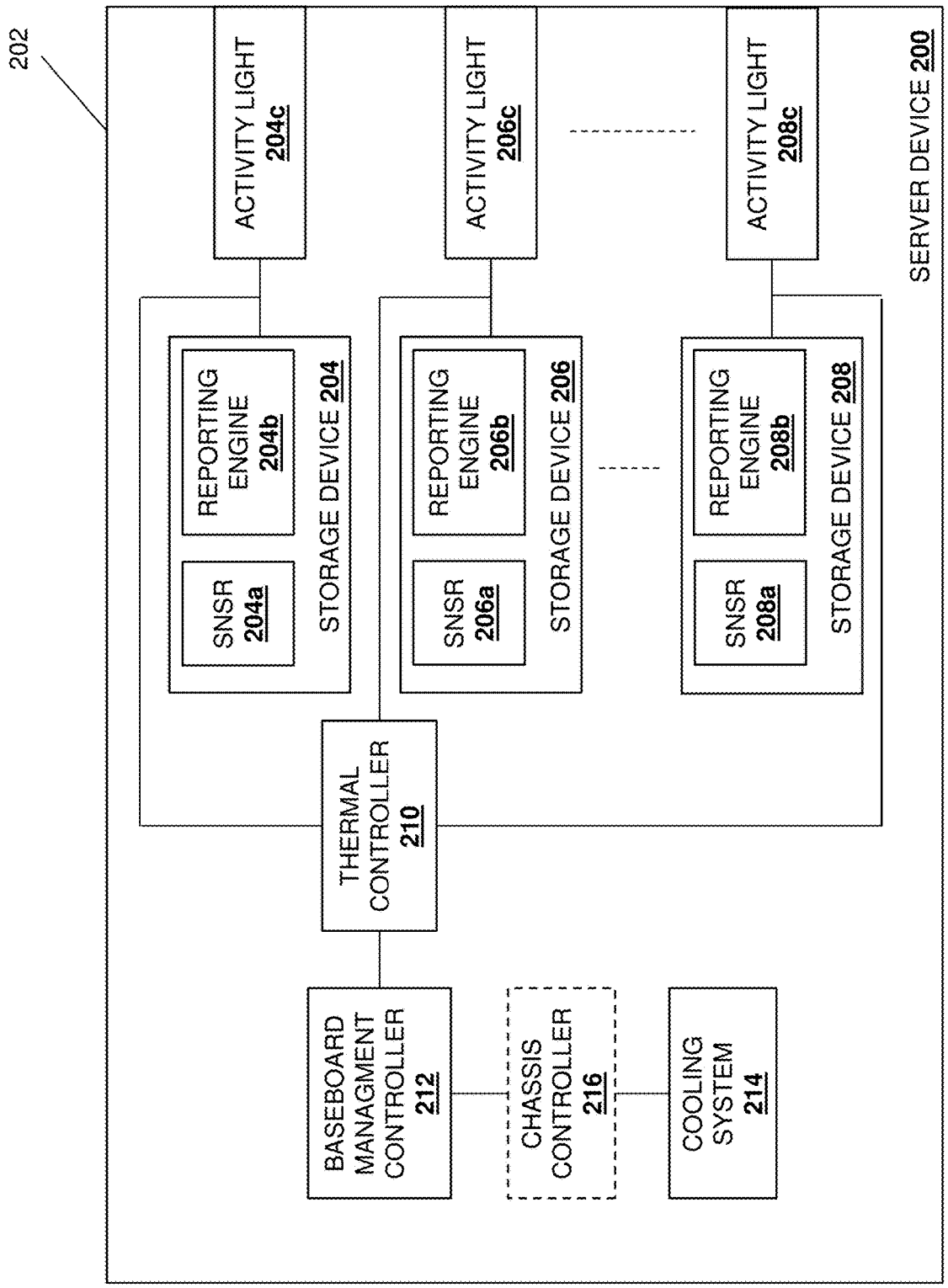
FIG. 2 is a schematic view illustrating an embodiment of a server device that incorporates the activity-light-based parameter reporting system of the present disclosure.

Referring now to FIG. 2, an embodiment of a server device 200 is illustrated that utilizes the activity-light-based parameter reporting system of the present disclosure. The server device 200 may be provided by the IHS 100 discussed above with reference to FIG. 1, and/or may include some or all of the components of the IHS 100. However, while the activity-light-based parameter reporting system is illustrated and described as being provided by a storage device in a server device, one of skill in the art in possession of the present disclosure will recognize that the teachings of the present disclosure may be applied to components in storage systems (e.g., Redundant Array of Independent Disk (RAID) systems), networking systems (e.g., switches, routers, etc.), desktop computing devices, laptop/notebook computing devices, and/or a variety of other computing devices while remaining within the scope of the present disclosure. In the illustrated embodiment, the server device includes a chassis 202 that houses the components of the server device 200, only some of which are illustrated in FIG. 2. For example, in the illustrated embodiment, the chassis 202 houses a plurality of components that are provided in the examples discussed below by a storage device 204, a storage device 206, and up to a storage device 208. However, one of skill in the art in possession of the present disclosure will recognize that components utilizing the activity-light-based parameter reporting system of the present disclosure may include, for example, any components that are configured to report their activity via an associated activity light, and that are associated with parameters that may be reported via sideband communications using that activity light as well.

In the illustrated embodiment, the storage device 204 includes a parameter sensor 204a that, in the examples discussed below, is a temperature parameter sensor that is configured to sense a temperature (e.g., an internal temperature of the storage device) generated by one or more components of the storage device 204. However, one of skill in the art in possession of the present disclosure will recognize that the parameter sensor 204a may be configured to sense any parameter of interest associated with the storage device 204 (or other component) while remaining within the scope of the present disclosure as well. The storage device 204 may also include a processing system (e.g., not illustrated, but which may include the processor 102 discussed above with reference to FIG. 1, a portion of firmware, a portion of a controller, and/or other processing components known in the art) and a memory system (e.g., not illustrated, but which may include the memory 114 discussed above with reference to FIG. 1, a portion of firmware, a portion of a controller, and/or other memory components known in the art) that is coupled to the processing system and that includes instructions that, when executed by the processing system, cause the processing system to provide a parameter reporting engine 204b that is configured to perform the functionality of the parameter reporting engines and storage devices discussed below. The parameter reporting engine 204b is coupled to the parameter sensor 204a, as well as to an activity light 204c that is described in the examples below as a storage device activity light, but which may be provided by any component activity light while remaining within the scope of the present disclosure. In specific examples, the activity light 204c may be provided by a Light Emitting Device (LED), although other lighting components will fall within the scope of the present disclosure as well.

Similarly, the storage device 206 includes a parameter sensor 206a that, in the examples discussed below, is a temperature parameter sensor that is configured to sense a temperature (e.g., an internal temperature of the storage device) generated by one or more components of the storage device 206. However, one of skill in the art in possession of the present disclosure will recognize that the parameter sensor 206a may be configured to sense any parameter of interest associated with the storage device 206 (or other component) while remaining within the scope of the present disclosure as well. The storage device 206 may also include a processing system (e.g., not illustrated, but which may include the processor 102 discussed above with reference to FIG. 1, a portion of firmware, a portion of a controller, and/or other processing components known in the art) and a memory system (e.g., not illustrated, but which may include the memory 114 discussed above with reference to FIG. 1, a portion of firmware, a portion of a controller, and/or other memory components known in the art) that is coupled to the processing system and that includes instructions that, when executed by the processing system, cause the processing system to provide a parameter reporting engine 206b that is configured to perform the functionality of the parameter reporting engines and storage devices discussed below. The parameter reporting engine 206b is coupled to the parameter sensor 206a, as well as to an activity light 206c that is described in the examples below as a storage device activity light, but which may be provided by any component activity light while remaining within the scope of the present disclosure. In specific examples, the activity light 206c may be provided by a Light Emitting Device (LED), although other lighting components will fall within the scope of the present disclosure as well.

Similarly, the storage device 208 includes a parameter sensor 208a that, in the examples discussed below, is a temperature parameter sensor that is configured to sense a temperature (e.g., an internal temperature of the storage device) generated by one or more components of the storage device 208. However, one of skill in the art in possession of the present disclosure will recognize that the parameter sensor 208a may be configured to sense any parameter of interest associated with the storage device 208 (or other component) while remaining within the scope of the present disclosure as well. The storage device 208 may also include a processing system (e.g., not illustrated, but which may include the processor 102 discussed above with reference to FIG. 1, a portion of firmware, a portion of a controller, and/or other processing components known in the art) and a memory system (e.g., not illustrated, but which may include the memory 114 discussed above with reference to FIG. 1, a portion of firmware, a portion of a controller, and/or other memory components known in the art) that is coupled to the processing system and that includes instructions that, when executed by the processing system, cause the processing system to provide a parameter reporting engine 208b that is configured to perform the functionality of the parameter reporting engines and storage devices discussed below. The parameter reporting engine 208b is coupled to the parameter sensor 208a, as well as to an activity light 208c that is described in the examples below as a storage device activity light, but which may be provided by any component activity light while remaining within the scope of the present disclosure. In specific examples, the activity light 208c may be provided by a Light Emitting Device (LED), although other lighting components will fall within the scope of the present disclosure as well.

In the illustrated embodiment, the chassis 202 also houses a thermal controller 210 that is illustrated as coupled to the coupling between each of the storage device 204a and its activity light 204c, the coupling between the storage device 206 and its activity light 206c, and the coupling between the storage device 208 and its activity light 208c. However, one of skill in the art in possession of the present disclosure will recognize that the thermal controller 210 may be coupled to the storage devices 204-208 and/or the activity lights 204c-208c (e.g., in any manner sufficient to monitor the driving of the activity lights 204c-208c by the storage devices 204-208, discussed below) while remaining within the scope of the present disclosure as well. In specific examples, the thermal controller 210 may be provided by a microcontroller, although one of skill in the art in possession of the present disclosure will recognize that any of a variety of thermal controller components will fall within the scope of the present disclosure as well.

In the illustrated embodiment, the chassis 202 houses a Baseboard Management Controller (BMC) 212 that is coupled to the thermal controller 210. In a specific example, the BMC 212 may be provided by the integrated DELL® Remote Access Controller (iDRAC) available from DELL® Inc. of Round Rock, Tex., United States, although other BMCs or components with similar functionality will fall within the scope of the present disclosure as well. As illustrated, the BMC 212 may be coupled directly to a cooling system 214 that is housed in the chassis 202, or via an optional chassis controller 216 that is house in the chassis 202. In different examples, the cooling system 214 may be provided by fans, fan controllers, heat sinks, heat pipes, and/or any other cooling component that would be apparent to one of skill in the art in possession of the present disclosure. While a specific server device 200 has been illustrated, one of skill in the art in possession of the present disclosure will recognize that server devices may include a variety components and/or component configuration for performing conventional server device functionality, as well as the functionality discussed below, while remaining within the scope of the present disclosure as well.

Figure 3:
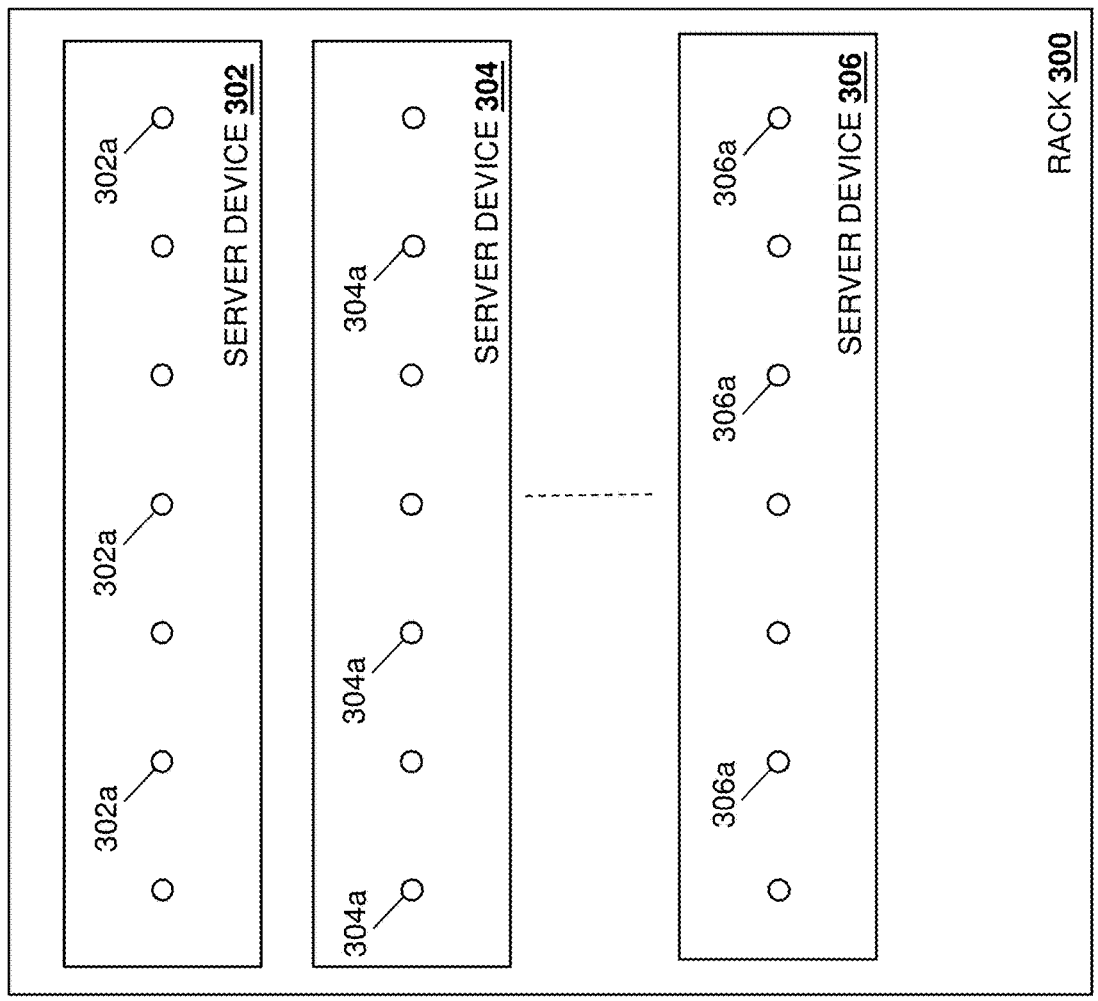
FIG. 3 is a schematic view illustrating an embodiment of a rack including a plurality of the server devices of FIG. 2.

Referring now to FIG. 3, an embodiment of a rack 300 is illustrated that houses a plurality of server devices 302, 304, and up to 306, any or all of which may be provided by the server device 200 discussed above with reference to FIG. 2. In the illustrated embodiment the each of the server devices 302, 304, and 306 includes a respective plurality of component activity lights 302a, 304a, and 306b, each of which are visible on a front surface of that server device and thus visible from a front of the rack 300. As discussed above, components such as the storage devices 204-208 in FIG. 2 have been developed that are configured to report their temperatures (and other non-activity parameters) to the thermal controller 210 by pulsing their storage device activity lights 204c-208c, with the thermal controller 210 monitoring the voltage provided to the storage device activity lights and decoding the pulses to identify temperatures being reported by the storage devices, as described in U.S. Pat. No. 10,055,127, assigned to the Assignee of the present disclosure, the disclosure of which is incorporated herein by reference. However, when such storage devices are provided in the server devices 302-306 in the rack 300, the reporting of their activity as well as other parameters via the activity lights 302a-306a produces a visual side effect that has been found to cause concern in users. For example, such activity-light-based temperature reporting functionality is relatively new and has not been seen by many users previously, and thus its occurrence (or lack thereof) can cause user concern, with some users fearing that the mechanism may be used to optically capture sensitive data. Furthermore, the repeated pulsing of storage device activity lights has been found to be aesthetically unpleasing to many users, particularly when performed by multiple storage devices in multiple server devices 302-306 in the rack 300, resulting in "messy" activity light behavior that is visible via the front of the rack 300.

Figure 4:
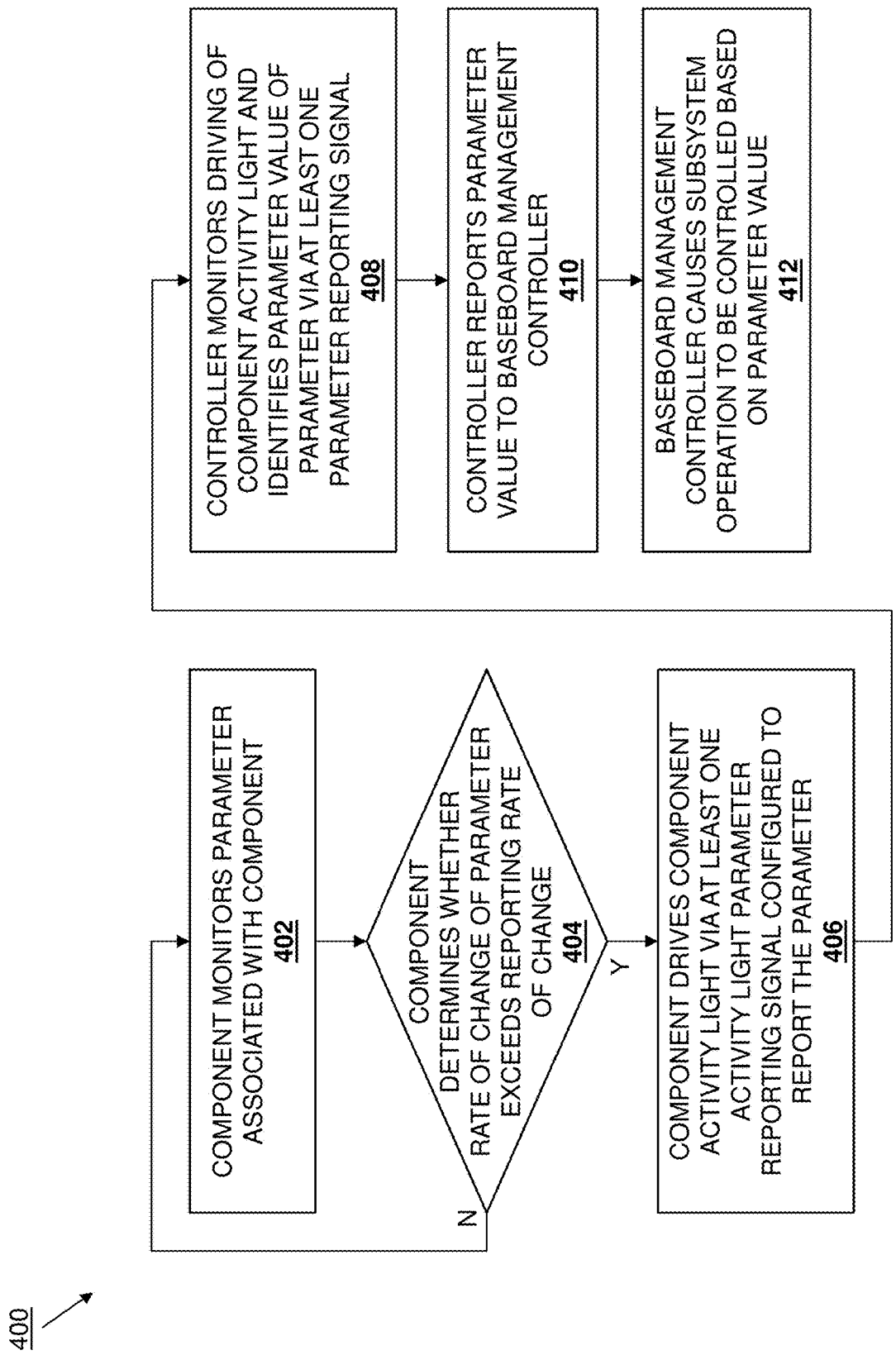
FIG. 4 is a flow chart illustrating an embodiment of a method for reporting component parameters using a component activity light.

Referring now to FIG. 4, an embodiment of a method 400 for reporting component parameters using a component activity light is illustrated. As discussed below, the systems and methods of the present disclosure may provide for activity-light-based parameter reporting updates from components in a manner that diminishes the visual side effect problems discussed above. In some embodiment, the activity-light-based parameter updates of the present disclosure may be reduced, and provided during periods of heavy user activity, by providing such activity-light-based parameter updates based on a rate of change of the parameter being reported, which results in the activity-light-based parameter updates being provided only during rapid parameter change activity which is generally associated with heavy user activity. Furthermore, the diminishing of the visual side effect problems discussed above may be enhanced further by providing tiers of parameter-rates-of-change that will result in activity-light-based parameter updates, and/or only providing such activity-light-based parameter updates when parameters are either increasing or decreasing (which, in the case of increasing temperature, may be the direction of parameter change that is of particular interest and/or associated with increased component activity). Finally, in some embodiments, components may share their component/parameter characteristics with a controller in order to provide the controller more insight to the significance of the activity-light-based parameter updates, which may operate to further reduce the activity-light-based parameter updates and the associated visual side effect problems discussed above. As such, the reporting of parameters via activity lights by components is improved by reducing visual side effects associated with such reporting that may be concerning to users.

Figure 5A:
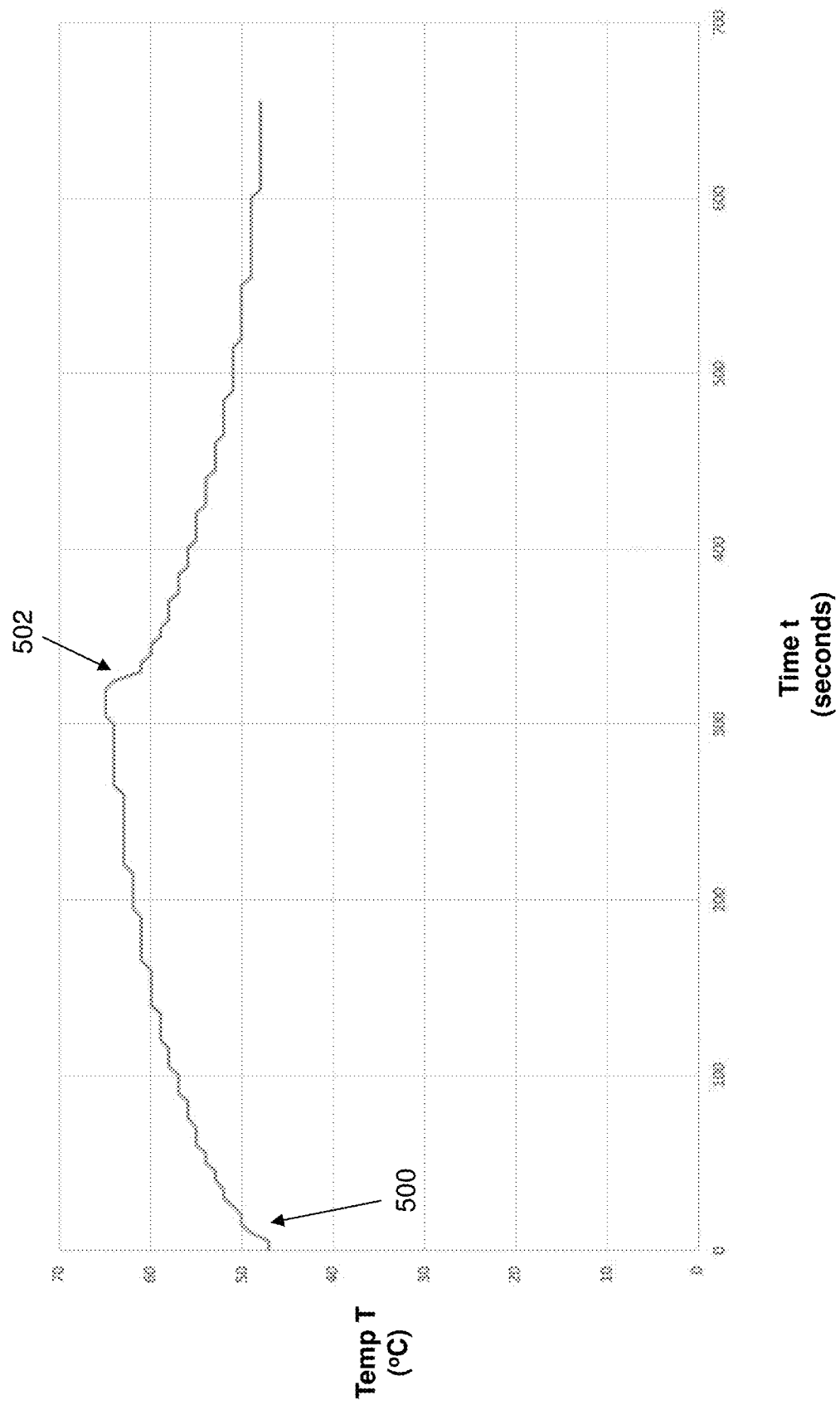
FIG. 5A is a graph view illustrating an embodiment of temperature vs. time for a storage device.

The method 400 beings at block 402 where a component monitors a parameter associated with that component. In an embodiment, at block 402, the parameter reporting engines 204b, 206b, and 208b in the storage devices 204, 206, and 208, respectively, may monitor the any parameter reported by their respective parameter sensors 204a, 204b, and 204c. In the examples below, the parameter monitored during the method 400 is a temperature parameter monitored by a temperature parameter sensor, but one of skill in the art in possession of the present disclosure will recognize that the parameter sensors 204a-208a may be provided by any of a variety of parameter sensors that are configured to monitor any parameters generated by their storage devices 204-208 while remaining within the scope of the present disclosure as well. Furthermore, while the example of the method 400 provided herein discusses the monitoring of parameters in storage devices, parameters in any component may be monitored in a similar manner while remaining within the scope of the present disclosure as well. Referring to FIG. 5A, an experimental embodiment is illustrated that provided for the measurement of a temperature T (in degrees Celsius) over a time t (in seconds) for an SSD storage device during a stress test. In the experimental embodiment illustrated in FIG. 5A, a temperature increase 500 and a temperature decrease 502 are noted for further discussion below.

The method 400 then proceeds to decision block 404 where the component determines whether a rate of change of the parameter exceeds a reporting rate of change. In an embodiment of block decision 404, the parameter reporting engines 204b, 206b, and 208b in the storage devices 204, 206, and 208, respectively, may monitor parameters reported by their respective parameter sensors 204a, 204b, and 204c, and determine whether the rate of change of the parameters reported by their respective parameter sensors 204a, 204b, and 204c exceeds a reporting rate of change. The inventors of the present disclosure have recognized that the temperature of storage devices during operation will depend on their thermal mass, with relatively high thermal mass storage devices changing temperature in response to their operation relatively slowly, and relatively low thermal mass storage devices changing temperature in response to their operation relatively quickly. For example, Hard Disk Drive (HDD) storage devices have a relatively high thermal mass and are associated with relatively low amounts of operation-induced heating, resulting in relatively slow temperature changes in HDD storage devices. Solid State Device (SSD) storage devices have a relatively low thermal mass and are associated with relatively high amounts of operation-induced heating, resulting in relatively fast temperature changes in SSD storage devices. As such, SSD storage devices exhibit relatively rapid heating responses, and are highly susceptible to their environments (e.g., the NAND flash memory controllers included in SSD storage devices can operate at temperatures of 120 degrees Celsius or more, generally should be kept at temperatures below 70 degrees Celsius, and may start throttling their performance at temperatures higher than 65 degrees Celsius.) Finally, hybrid HDD/SDD storage devices have characteristics of both HDD storage devices and SSD storage devices, as they leverage SSD storage devices as a cache. In some embodiments, at least in part based on the recognition of such thermal-mass-dependent storage device temperature rates-of-change, the storage devices provided according to the teachings of the present disclosure may be configured to determine the rate of change of their internal temperatures.

Figure 5B:
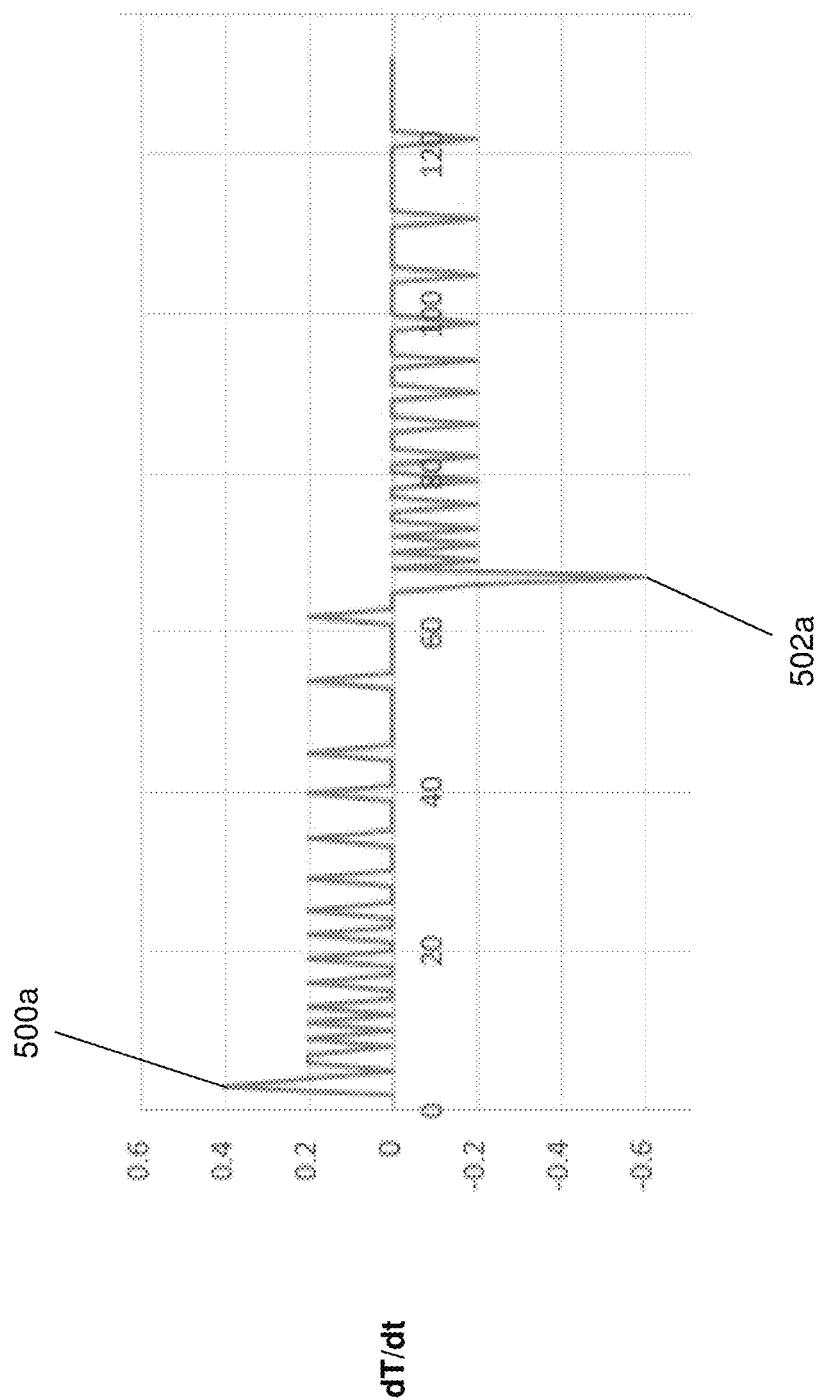

As such, in an embodiment of block decision 404, the parameter reporting engines 204b, 206b, and 208b in the storage devices 204, 206, and 208, respectively, may monitor temperature parameters reported by their respective parameter sensors 204a, 204b, and 204c, and determine whether the rate of change of the internal temperature parameters reported by their respective parameter sensors 204a, 204b, and 204c exceeds a reporting rate of change. With reference to FIG. 5B, an experimental embodiment that provided for the determination of a rate of change (dT/dt) of the temperature T (in degrees Celsius) over the time t (in seconds) of FIG. 5a (i.e., the first derivative of the temperature T over the time t) is illustrated. In the experimental embodiment illustrated in FIG. 5B, a rate 500a of the temperature increase 500 in FIG. 5A, and a rate 502a of the temperature decrease 500b in FIG. 5A, are noted. In this experimental embodiment, the reporting rate of change was 0.3 T/t (° C./s) and, as such, the rates 500a and 502a of the temperature increase 500 and temperature decrease 502, respectively, were found to exceed the reporting rate of change, while the remaining rates of the temperature changes did not exceed the reporting rate of change.

Figure 5C:
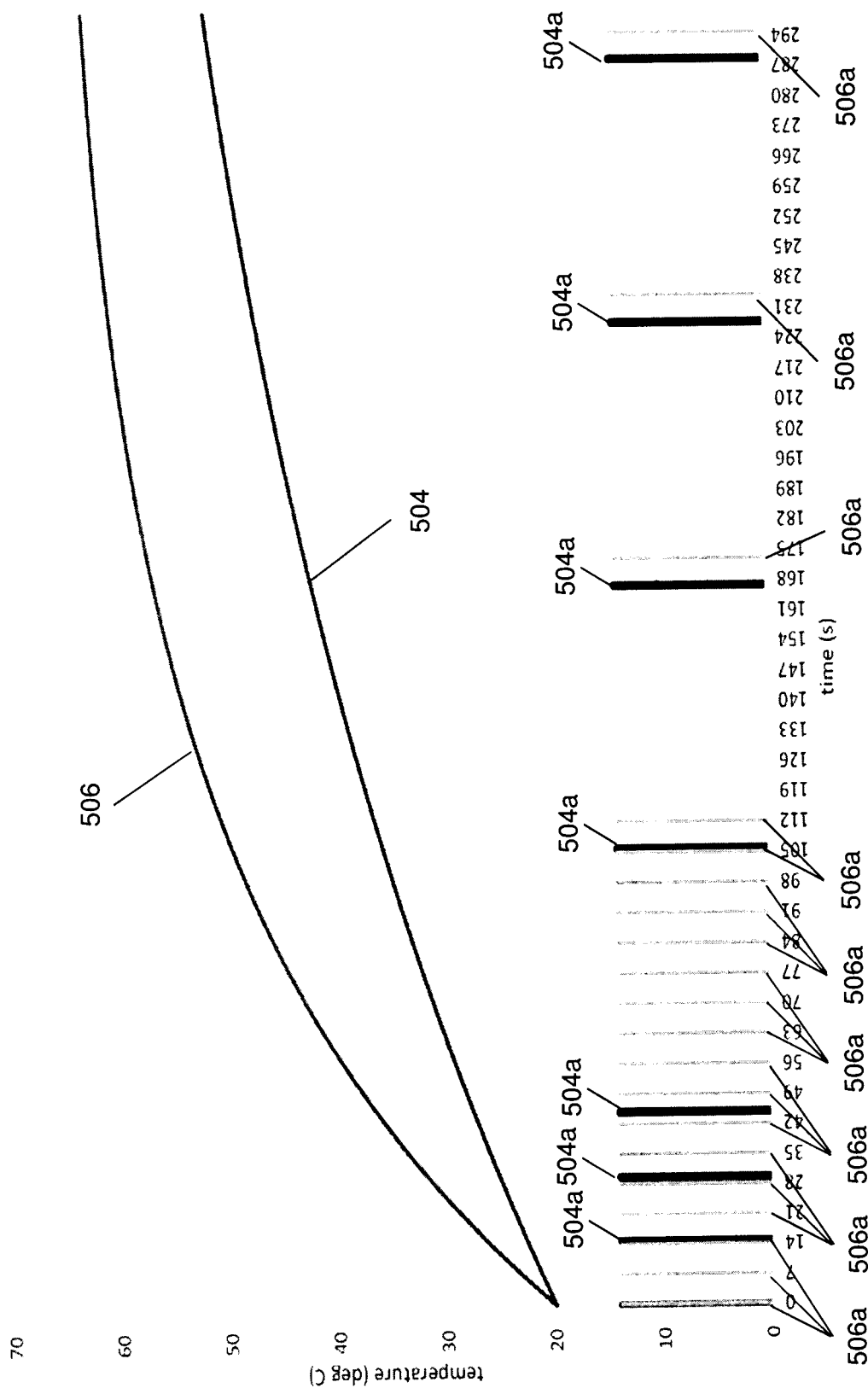
FIG. 5C is a graph view illustrating an experimental embodiment of vs. time for an HDD and an SDD, along with HDD temperature reporting packets and SDD temperature reporting packets sent based on the rate of change of those temperatures.

However, while a specific reporting rate of change for the temperature parameter is illustrated and described above, a reporting rate of change for a temperature parameter (or any other parameter being monitored and reported) may be selected based on any of a variety of factors associated with the component producing the temperature/parameter, the system in which the component is located, the parameter itself, and/or any other considerations that would be apparent to one of skill in the art in possession of the present disclosure. Furthermore, components may monitor their parameters (e.g., the temperature parameter discussed above) at any internal interval the component is configured for, and may determine the rate of change of that parameter at any internal interval as well. With reference to FIG. 5C, an experimental embodiment of temperature (in degrees Celsius) vs. time (in seconds) for an HDD 504 and an SDD 506 is illustrated, along with HDD temperature reporting packets 504a and SDD temperature reporting packets 506a sent based on the rate of change of those temperatures. As can be seen, as the temperatures of the HDD 504 and the SDD 506 increase over time, the HDD 504 is configured to check its temperature every 15 seconds, while the SDD 506 is configured to check its temperature every 7 seconds. As discussed above, the temperature of the SDD 506 increases faster than the temperature of the HDD 504 due to its lower thermal mass, and causes the SDD 506 to send more SDD temperature reporting packets 506a relative to the HDD temperature reporting packets 504a sent by the HDD 504. As the rate of change of the temperature decreases, and standard reporting interval (e.g., 60 seconds) may be provided.

If, at decision block 404, the component determines that the rate of change of the parameter does not exceed the reporting rate of change, the method 400 returns to block 402 where the component continues to monitor the parameter associated with the component. For example, with reference to FIGS. 5A and 5B, for any of the rates of change of the temperature parameter other than the rate 500a of temperature increase 500 and the rate 502a of temperature decrease 502a, the parameter reporting engines 204b-208b in the storage devices 204-208, respectively, will determine that those rates of change of the temperature parameter do not exceed the reporting rate of change (e.g., 0.3 T/t (° C./s) in this embodiment), and will continue to monitor the temperature parameter. As such, the method 400 may loop through blocks 402 and 404 as long as the rate of change of the parameter associated with the component does not exceed the reporting rate of change.

If, at decision block 404, the component determines that the rate of change of the parameter exceeds the reporting rate of change, the method 400 proceeds to block 406 where the component drives a component activity light via at least one activity light parameter reporting signal that is configured to report the parameter. For example, with reference to FIGS. 5A and 5B, for the rate 500a of temperature increase 500 and the rate 502a of temperature decrease 502a, the parameter reporting engines 204b-208b in the storage devices 204-208, respectively, will determine that those rates of change of the temperature parameter exceed the reporting rate of change (e.g., 0.3 T/t (° C./s) in this embodiment), and will proceed to block 406 where the parameter reporting engines 204b-208b in the storage devices 204-208, respectively, drive their associated activity lights 204c-208c via at least one activity light parameter reporting signal. In an embodiment, at block 406, any of the parameter reporting engines 204b-208b in the storage devices 204-208 that determine that a rate of change of the parameter detected via their parameter sensors 204a-208a has exceeded the reporting rate of change may then drive their activity light 204c-208c via at least one activity light parameter reporting signal that may be provided by, for example, activity light driving voltage(s) that are configured to pulse (e.g., repeatedly illuminate and de-illuminate) that activity light. U.S. Pat. No. 10,055,127, assigned to the Assignee of the present disclosure, describes the driving of activity lights via a voltage or other signal provided by a storage device, and that disclosure is incorporated herein by reference.

Figure 6:
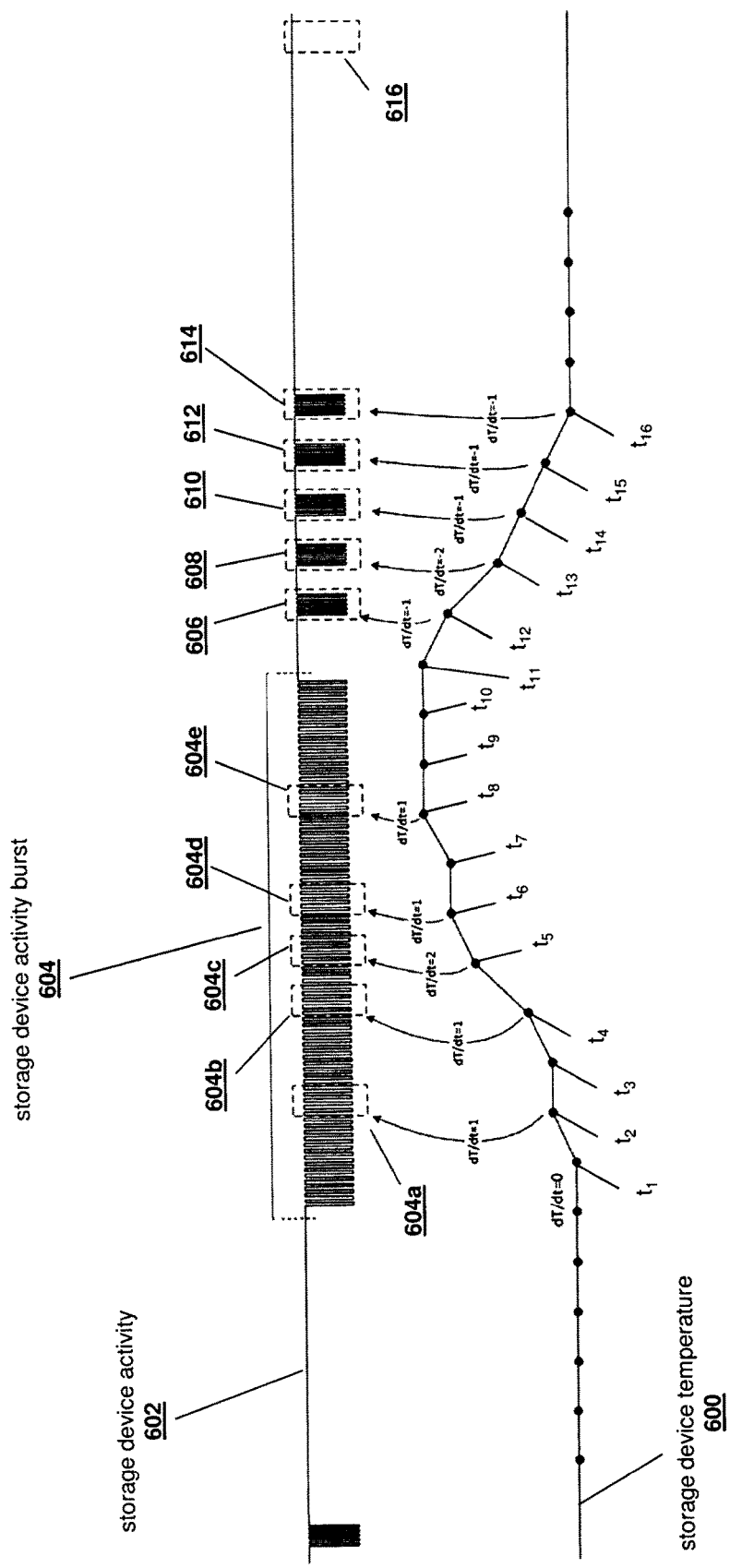
FIG. 6 is a chart illustrating an embodiment of temperature reporting based on the rate of change of the temperature of a storage device.

Referring now to FIG. 6, an example of the reporting of temperature parameter reporting based on the rate of change of that temperature parameter is illustrated. In FIG. 6, a storage device temperature 600 for a storage device is plotted below a storage device activity 602 of that storage device, with that storage device configured to report its temperature (e.g., via the activity lights as discussed above) when the absolute value of the rate of change of the temperature (dT/dt) is equal to or greater than 1 a. As can be seen in FIG. 6, prior to time $t_1$, the storage device is relatively inactive, and the rate of change of the temperature dT/dt is 0. However, a storage device activity burst 604 begins prior to time $t_1$, and at time $t_2$ the storage device temperature 600 has increased and the rate of change of the temperature dT/dt is 1, which causes a report 604a of the temperature of the storage device to be made. Between time $t_2$ and time $t_3$, the storage device temperature 600 does not increase, and the rate of change of the temperature dT/dt again drops to 0. Between time $t_3$ and time $t_4$, the storage device temperature 600 increases, and the rate of change of the temperature dT/dt is 1, which causes a report 604b of the temperature of the storage device to be made. Between time $t_0$ and time $t_5$, the storage device temperature 600 increases, and the rate of change of the temperature dT/dt is 2, which causes a report 604c of the temperature of the storage device to be made. Between time $t_5$ and time $t_6$, the storage device temperature 600 increases, and the rate of change of the temperature dT/dt is 1, which causes a report 604d of the temperature of the storage device to be made. Between time $t_6$ and time $t_7$, the storage device temperature 600 does not increase, and the rate of change of the temperature dT/dt again drops to 0. Between time $t_7$ and time $t_8$, the storage device temperature 600 increases, and the rate of change of the temperature dT/dt is 1, which causes a report 604e of the temperature of the storage device to be made. Between time $t_7$ and time $t_9$, time $t_9$ and time $t_{10}$, and time $t_{10}$ and time $t_{11}$, the storage device temperature 600 does not increase, and the rate of change of the temperature dT/dt again drops to 0. In addition, between time $t_{10}$ and time $t_{11}$, the storage device activity burst 604 ends.

Between time $t_{11}$ and time $t_{12}$, the storage device temperature 600 decreases, and the rate of change of the temperature dT/dt is −1, which causes a report 606 of the temperature of the storage device to be made. Between time $t_{12}$ and time $t_{13}$, the storage device temperature 600 decreases, and the rate of change of the temperature dT/dt is −2, which causes a report 608 of the temperature of the storage device to be made. Between time $t_{13}$ and time $t_{14}$, the storage device temperature 600 decreases, and the rate of change of the temperature dT/dt is −1, which causes a report 610 of the temperature of the storage device to be made. Between time $t_{14}$ and time $t_{15}$, the storage device temperature 600 decreases, and the rate of change of the temperature dT/dt is −1, which causes a report 612 of the temperature of the storage device to be made. Between time $t_{15}$ and time $t_{16}$, the storage device temperature 600 decreases, and the rate of change of the temperature dT/dt is −1, which causes a report 614 of the temperature of the storage device to be made. Following time $t_{16}$, the storage device is relatively inactive, and the rate of change of the temperature dT/dt is 0. FIG. 6 also illustrates how a report 616 of the temperature of the storage device may be made following time $t_{16}$, which may be provided as a default temperature report following the last temperature report at time $t_{16}$ (e.g., made at a default reporting interval following the last dT/dt equal to or greater than 1).

In a specific example, the parameter reporting engines 204b-208b may include state machines that are configured to drive their associated activity lights 204c-208c, respectively, in order to report temperature parameters determined by their parameter sensors 204a-208a for their associated storage devices 204-208, respectively, at an increased parameter reporting rate. As such, one of skill in the art in possession of the present disclosure will recognize how blocks 404 and 406 of the method 400 provide the parameter reporting engines 204b-208b that, upon seeing a significant up or down slope in a parameter (e.g., the temperature parameter rate of change that exceeds the reporting rate of change), may restart the state machine to drive the activity lights 204c-208d at a second parameter reporting rate that exceeds a first parameter reporting rate at which the parameter was previously being reported. As such, any of the parameter reporting engines 204b-208b may drive their associated activity lights 204c-208c at a first parameter reporting rate prior to detecting that a rate of change of the temperature parameter has exceeded the reporting rate of change, and may drive their associated activity lights 204c-208c at a second parameter reporting rate that is higher than the first parameter reporting rate subsequent to detecting that the rate of change of the temperature parameter has exceeded the reporting rate of change.

In some embodiments, a rate at which the parameter reporting engine 204b-208b reports a parameter (e.g., via the driving of the activity lights 204c-208c) may change based on the level of the rate of change of that parameter. For example, any of the parameter reporting engines 204b-208b may drive their associated activity lights 204c-208c at a first parameter reporting rate in response to detecting that a rate of change of the temperature parameter has exceeded a first reporting rate of change, may drive their associated activity lights 204c-208c at a second parameter reporting rate that is higher than the first parameter reporting rate in response to detecting that the rate of change of the temperature parameter has exceeded a second reporting rate of change that is higher than the first reporting rate of change, may drive their associated activity lights 204c-208c at a third parameter reporting rate that is higher than the second parameter reporting rate in response to detecting that the rate of change of the temperature parameter has exceeded a third reporting rate of change that is higher than the second reporting rate of change. As such, the storage devices 204-208 may report their temperatures at a minimal parameter rate when those temperatures are changing slowly, at an intermediate parameter reporting rate when those temperatures are changing at an increased level, and at a highest parameter reporting rate when those temperatures are changing rapidly. Such embodiments may be utilized with server devices and/or other systems that utilize a diverse range of combinations of storage devices and/or other components, each of which may vary in heating cooling efficacy, which operates to reduce storage-device-to-server-device visual updates that are perceptible by users.

Figure 7:
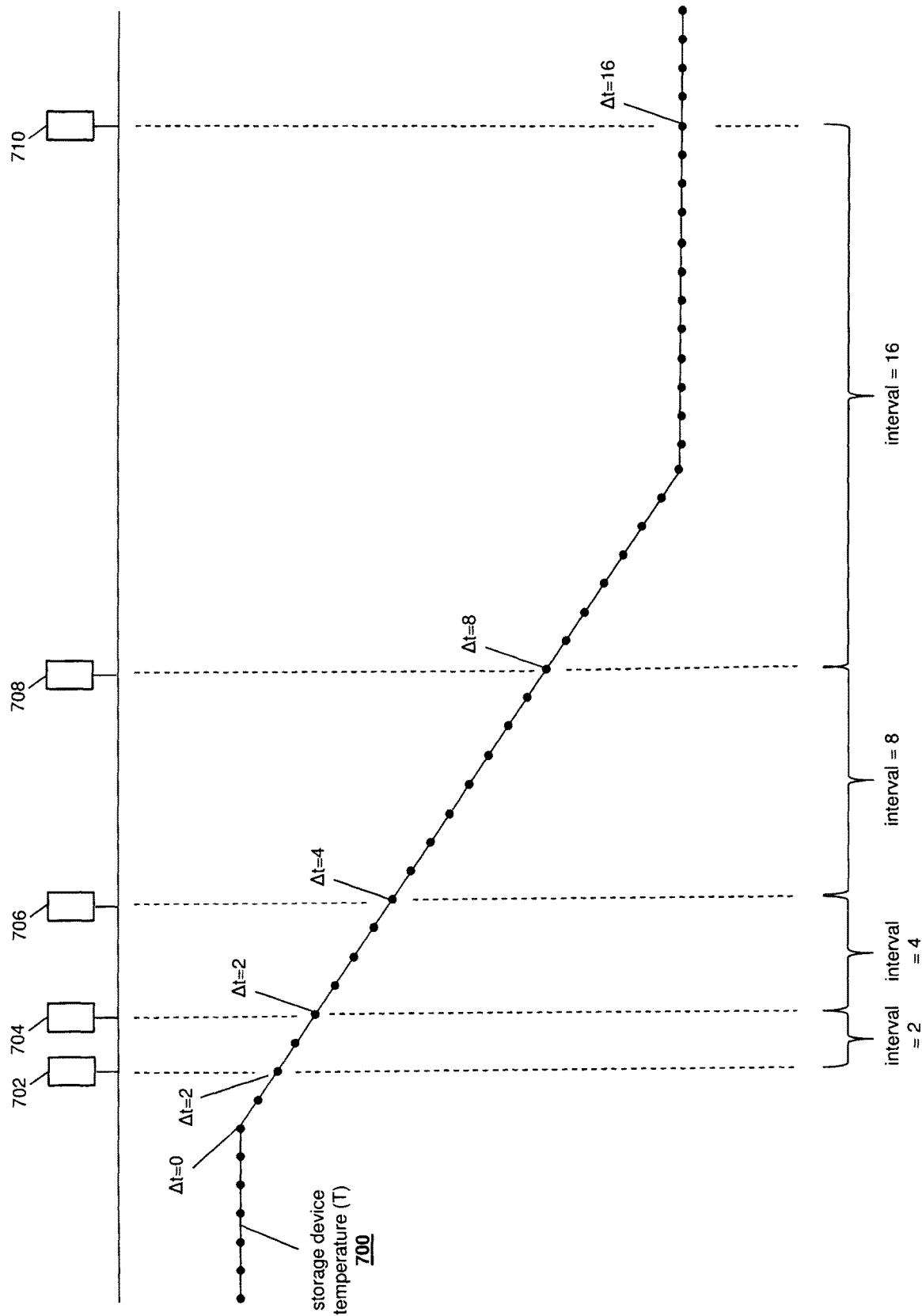
FIG. 7 is a chart illustrating an embodiment of incremental/exponential back-off of temperature reporting based on the rate of change of the temperature of a storage device.

In some embodiments, the parameter reporting engines 204b-208b may be configured to incrementally reduce the reporting of parameters after increasing their parameter reporting rate in response to the detection of the parameter rate of change exceeding the reporting rate of change. For example, the restarting of the state machines included in the parameter reporting engines 204b-208b may cause those state machines to drive their associated activity lights 204c-208c, respectively, at the increased parameter reporting rate (e.g., the second parameter reporting rate discussed above), and those state machines may then reduce the driving of their associated activity light 204c-208c exponentially back to the initial parameter reporting rate (e.g., the first reporting rate discussed above). With reference to FIG. 7, an embodiment of such activity light driving/parameter reporting is illustrated. As can be seen in FIG. 7, prior to $\Delta t=0$, a storage device temperature 700 is constant, and following $\Delta t=0$, the storage device temperature 700 begins to decrease at a constant rate. As such, the rate of change of the storage device temperature 700 may be determined by the parameter reporting engines 204b-208b as exceeding the reporting rate of change immediately following $\Delta t=0$, and then will subsequently be viewed as constant as the storage device temperature 700 decreases at a constant rate.

As discussed above, following the detection of the rate of change of the storage device temperature 700 as exceeding the reporting rate of change, the state machines included in the parameter reporting engines 204b-208b may be restarted to increase the parameter reporting rate. As such, FIG. 7 illustrates how the state machines may make a temperature parameter report 702 at $\Delta t=2$, followed by a temperature report 704 made at $\Delta t=2$ (e.g., an interval of 2) following the temperature parameter report 702, followed by a temperature report 706 made at $\Delta t=4$ (e.g., an interval of 4) following the temperature parameter report 704, followed by a temperature report 708 made at $\Delta t=8$ (e.g., an interval of 8) following the temperature parameter report 706, followed by a temperature report 710 made at $\Delta t=16$ (e.g., an interval of 16) following the temperature parameter report 708. While one of skill in the art in possession of the present disclosure will recognize that the change from the constant decrease in temperature to the constant temperature between $\Delta t=8$ and $\Delta t=16$ in FIG. 7 would result in a rate of change of the temperature parameter being detected (which could result in the state machine being restarted to increase the temperature parameter reporting rate once again), such functionality is not illustrated in FIG. 7 to more clearly illustrate the exponential reduction of increased temperature reporting that may be enabled by the state machines in the parameter reporting engine 204b-208b, and may also cover embodiments in which decreases in temperature do not result in an increase in the temperature parameter reporting rate, discussed in further detail below.

Thus, the parameter reporting engines 204c-208b may be configured (e.g., via state machines) to report a parameter at a first parameter reporting rate prior to detecting a rate of change of the parameter that exceeds the reporting rate of change, then to report that parameter at a second parameter reporting rate (e.g., via a restarting of the state machines) subsequent to detecting the rate of change of the parameter that exceeds the reporting rate of change, and then to incrementally reduce the reporting of that parameter back to the first parameter reporting rate (e.g., via operation of the state machines). While the exponential incremental reduction of the increased second parameter reporting rate to the initial first parameter reporting rate has been described, one of skill in the art will recognize that a variety of incremental reduction characteristics may be provided by the parameter reporting engines 204b-208b while remaining within the scope of the present disclosure as well.

As such, the storage devices 204-208 may be configured (e.g., via their parameter reporting engines 204b-208b) to frequently (e.g., no less than once per second) determine the rate of change of their temperatures, with relatively high rates of temperature change implying an immediate need to send temperature reports at increased intervals due to the rapidly changing state of the storage device thermal state (which may necessitate the server thermal control system receive more regularly updated temperature data). In many embodiments, such reporting of rapid changes in temperature of the storage devices may apply to both temperature increases (i.e., when the storage device is relatively active) and temperature decreases (e.g., when there are significant pauses in storage device activity), either of which can induce rapid temperature changes in the storage device. As discussed below, different server devices may be configured to react to these temperature reports in different ways.

However, in some embodiments, component-to-system parameter reporting may be reduced further. For example, storage-device-to-server-device temperature parameter reporting may be reduced by not providing such temperature reports when the temperature of the storage device is decreasing, which operates to prevent users from seeing the visual temperature reporting artifacts discussed above when no storage device activity is occurring. As such, the parameter reporting engines 204b-208b may be configured to only report temperature based on positive rates of change (dT/dt) of the temperature of their storage devices 204-208 via their activity lights 204c-208c, while not reporting temperature based on negative rates of change (dT/dt) of the temperature of their storage devices 204-208 via their activity lights 204c-208c. However, such embodiments may potentially lead to the storage devices being overcooled. Such overcooling may be remedied by having the parameter reporting engines 204b-208b report temperature based on positive rates of change (dT/dt) of the temperature of their storage devices 204-208 via their activity lights 204c-208c at a first parameter reporting rate, while reporting temperature based on negative rates of change (dT/dt) of the temperature of their storage devices 204-208 via their activity lights 204c-208c at a second parameter reporting rate that is lower than the first rate. While such embodiments may be wasteful of cooling subsystem power, they may be desirable in some cases.

The method 400 then proceeds to block 408 where a controller monitors the driving of the component activity light and identifies the parameter value of the parameter via the at least one parameter reporting signal. In an embodiment, at block 408, the thermal controller 210 may monitor the couplings between the storage devices 204-208 and the their respective activity lights 204c-208c, and determine when at least one parameter reporting signal is transmitted by their respective parameter reporting engines 204b-208b to those activity lights 204c-208c. When parameter reporting signal(s) are detected, the thermal controller 210 will identify parameter value(s) of the parameter being reported by the parameter reporting engine(s) 204b-208c as discussed above. U.S. Pat. No. 10,055,127, assigned to the Assignee of the present disclosure, describes the identification of parameter value(s) of a parameter being reported by a storage device, and that disclosure is incorporated herein by reference The method 400 then proceeds to block 410 where the controller reports the parameter value to a baseboard management controller, as well as block 412 where the baseboard management controller causes a subsystem operation to be controlled based on the parameter value. In an embodiment, at block 410, the thermal controller 210 may operate to report the parameter value identified at block 408 to the baseboard management controller 212. For example, at block 410, the thermal controller 210 may report any temperature of any of the storage devices 204-208 that was identified at block 408 to the baseboard management controller 212. In an embodiment at block 412, the baseboard management controller 212 may operate to cause the cooling system 214 to be controlled based on the temperature of the storage device(s) 204-208. For example, at block 410, the baseboard management controller 212 may directly cause the cooling system 214 to be controlled based on the temperature of the storage device(s) 204-208, or may provide communicate with the optional chassis controller 216 to cause the cooling system 214 to be controlled based on the temperature of the storage device(s) 204-208 by, for example, activating a portion of the cooling system 214 (e.g., a fan) adjacent a storage device that was reported as having a temperature that was reported based on a temperature increase above the reporting rate of change, deactivating a portion of the cooling system 214 (e.g., a fan) adjacent a storage device that was reported as having a temperature that was reported based on a temperature decrease above the reporting rate of change, and/or performing any other cooling system operations that would be apparent to one of skill in the art in possession of the present disclosure.

In experimental embodiments, the systems and methods of the present disclosure have been found to introduce significant improvements to activity-light-based temperature parameter reporting by reducing the visual artifacts associated with conventional systems while providing the baseboard management controllers thermal control system with more timely temperature data, and also hiding user-visible activity-light-based temperature updates in the midst of actual user-driven activity (e.g., when the storage devices is active and increasing in temperature.) As such, idle storage devices appear "more idle", and active storage devices are more tightly regulated in their temperature reporting, saving power and reducing thermal control system fan oscillations.

In some embodiments of the present disclosure, the storage devices 204-208 may be configured (e.g., via their parameter reporting engines 204b-208b or other storage device components) to transmit their characteristics to the thermal controller 210 in order to provide the thermal controller 210 will more insight to the temperature parameter(s) (or other parameters) being reported by the storage devices 204-208. For example, in the case of reported thermal parameter(s), the storage devices 204-208 may transmit to the thermal controller 210 (in one or more transmissions) a storage device worst case power draw for that storage device and a storage device worst case dT/dt increase for that storage device prior to the operation of that storage device according to the method 400. Furthermore, following the operation of the storage devices 204-208 according to the method 400, the storage devices 204-208 may periodically transmit to the thermal controller 210 (in one or more transmissions) a storage device instantaneous power draw for that storage device, a storage device instantaneous dT/dt for that storage device, and a storage device instantaneous temperature for that storage device. One of skill in the art in possession of the present disclosure will recognize that providing the storage device/parameter characteristics discussed above results in a more complicated system, but allows the thermal controller 210 and the storage device(s) 204-208 to "agree" on a common set of parameters, allowing for the reduction in the number of temperature updates provided by the storage device(s) 204-208 to the thermal controller 210.

For example, given the storage device/parameter characteristics discussed above, the thermal controller 210 may receive fewer temperature parameter updates (relative to a system without such storage device/parameter characteristic sharing) that are more relevant (e.g., that require less interpretation), allowing the thermal controller 210 to better understand the current condition of the storage device, and the direction that condition is moving. As such, when no temperature parameter updates are received from any of the storage devices 204-208, the thermal controller 210 may assume that the previously reported thermal parameters are still "in play", and that the temperature of those storage device(s) are continuing in the same direction until the maximum or minimum limit for that storage device is reached.

In such embodiments, storage device maximum and/or minimum limits may be calculated based on ambient temperature, maximum power draw for that storage device (which may be self-characterized by that storage device), an understanding of the storage devices that are immediately adjacent that storage device (and the characteristics of those storage devices), a server device airflow, and/or any other characteristics of the server/storage devices being considered. Having storage devices self-characterize their characteristics allows the provisioning to the thermal controller of an accurate worst-case framework for the server device thermal control system for use in the event of a failure. For example, in the event that temperature updates from the storage device(s) 204/208 cease, the worst case scenario may be assumed by the thermal controller 210, but that characterization will (in most cases) be less than the worst case of any storage device coupled to the thermal controller 210. In a specific example, conventional Serial AT Attachment (SATA) storage devices typically operate at 3-5 watts, while Non-Volatile Memory express (NVMe) storage devices may operate at up to 25 watts in a worst case scenario, and in the event that a storage device stops reporting (e.g., due to some internal error or failure), having knowledge of the worst case power information for that storage device could prevent the thermal controller from over-compensating the system cooling, which can increase drive fan noise and power consumption unnecessarily. As such, a faulty NVMe storage device that indicate that it will consume a maximum of 15 watts will then be cooled appropriately, rather than automatically assuming that NVMe storage device will be consuming 25 watts.

Figure 8:
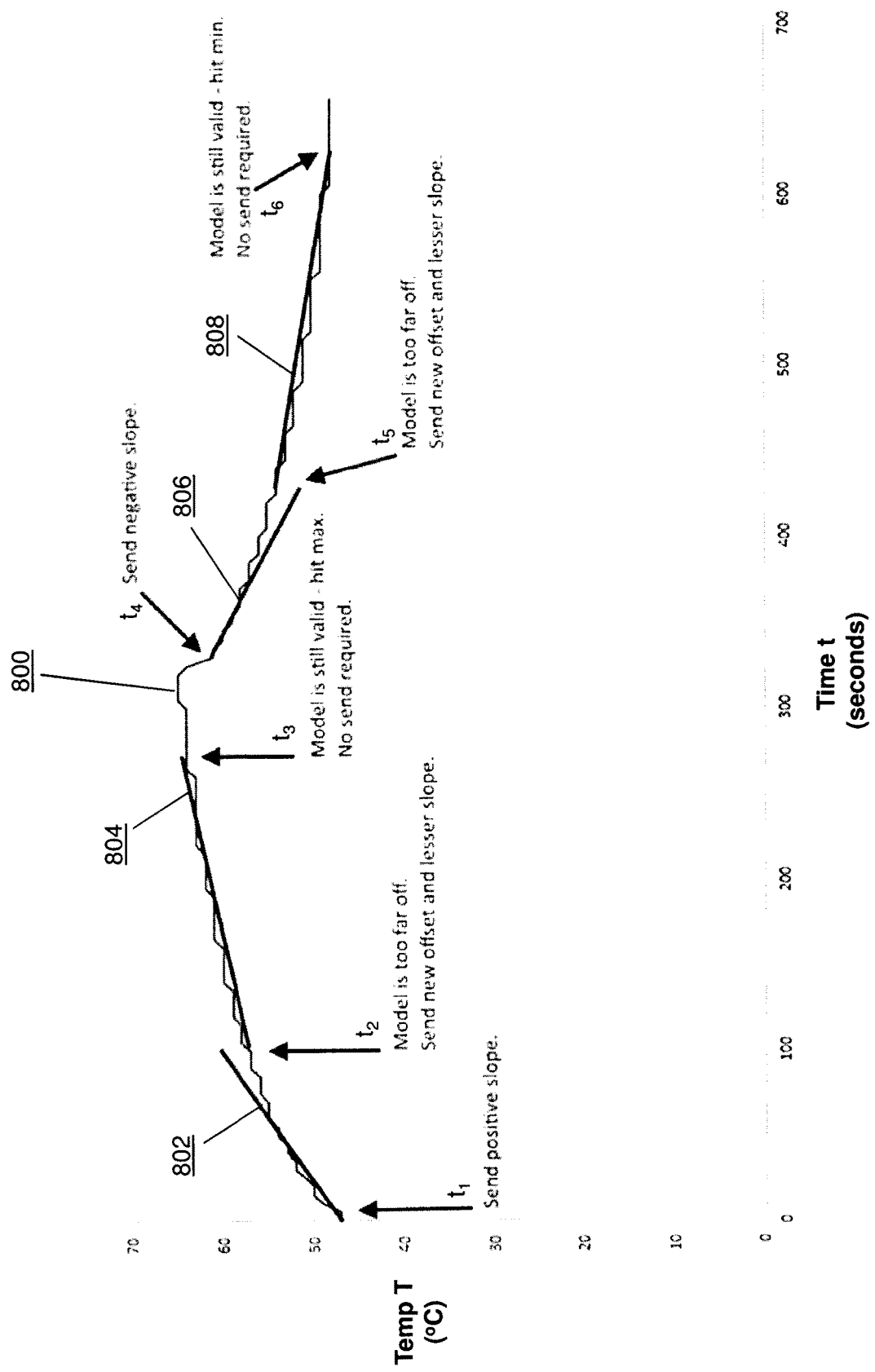
FIG. 8 is a graph illustrating an embodiment of temperature vs. time modeling for a storage device that has shared its storage device characteristics with a thermal controller in its server device.

In some embodiments, the temperature controller 210 and the storage devices 204-208 may utilized the characteristic sharing discussed above to implement a common temperature model for each of those storage devices, with each storage device sending its storage device/parameter characteristics to the temperature controller 210 upon initialization, and then only sending temperature updates based on the rate of change of their temperatures when the actual temperature of that storage device is not accurately represented by the temperature model being employed by the thermal controller 210 and storage device, or when a minimum temperature update time period (e.g., 60-120 seconds) has passed. For example, with reference to FIG. 8, the temperature 800 of a storage device is plotted against time. As can be seen, after initial characterization of the storage device, at time $t_1$, a first temperature model 802 is provided by the storage device to the temperature controller 210. At time $t_2$, the storage device may determine that the first temperature model 802 has diverged too far from the actual temperature of the storage device, and a second temperature model 804 may be provided by the storage device to the temperature controller 210. At time $t_3$, the storage device may determine that the second temperature model 804 is still valid as the storage device has hit a maximum limit determined for the storage device. At time $t_4$, the storage device may provide a third temperature model 806 that characterizes a decreasing temperature of the storage device, and at time $t_5$, the storage device may determine that the third temperature model 806 diverges too far from the actual temperature of the storage device, and send a fourth temperature model 808 to the thermal controller 210. Finally, at time $t_6$, the storage device may determine that the fourth temperature model is still valid as the storage device has hit a minimum limit determined for the storage device. As such, once the storage device of the example illustrated in FIG. 8 has initialized, it need only provide temperature (model) updates twice during its temperature increase, and provide temperature (model) updates twice during its temperature decrease, for a total of four temperature reports (i.e., via its activity light) over 600+ seconds (although redundancy consideration may provide for a higher minimum update time period.)

Thus, systems and methods have been described that provide more updated and accurate data via activity lights to the thermal control system relative to conventional systems, while producing a cleaner user visual experience and aesthetics relative to conventional systems, resulting is fewer occurrences of user concern with "weird blinking" of their server devices or fears of data exfiltration, as well as providing lower system power use and reduced system oscillations. Finally, the systems and methods of the present disclosure are forward-compatible with arbitrary storage device designs, including those yet-to-be created, as one of skill in the art in possession of the present disclosure will recognize that any storage device that monitors its internal temperature and reports that internal temperature via its activity light may be incorporated into the systems and methods of the present disclosure. For example, Heat Assist Magnetic Recording (HAMR) storage devices are being developed that include spinning platter drives, and that use a laser to heat the platter drives to store bits more densely. While such HAMR storage devices are in development, it is clear that their internal processes will induce heating of the HAMR storage device due to the writing mechanism, and conventional default temperature reporting rates may be insufficient. Utilizing the teachings of the present disclosure, HAMR storage devices may be allowed to function optimally with no engineering changes.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:
1. An activity-light-based parameter reporting system, comprising:
  a storage device activity light;
  a storage device that is coupled to the storage device activity light, wherein the storage device includes a parameter reporting engine that is configured to:
    monitor a parameter associated with the storage device;
    determine whether a rate of change of the parameter that includes a change in the parameter over a change in time has exceeded a reporting rate of change; and
    drive, in response to determining that the rate of change of the parameter has exceeded the reporting rate of change, the storage device activity light via at least one activity light parameter reporting signal that is configured to report the parameter; and
a controller that is configured to:
monitor the driving of the storage device activity light by the parameter reporting engine; and
identify a parameter value of the parameter via the at least one activity light parameter reporting signal used by the parameter reporting engine to drive the storage device activity light.

2. The system of claim 1, wherein the parameter reporting engine is configured to:
drive, prior to determining that the rate of change of the parameter has exceeded the reporting rate of change, the storage device activity light at a first parameter reporting rate in order to report the parameter; and
drive, subsequent to determining that the rate of change of the parameter has exceeded the reporting rate of change, the storage device activity light at a second parameter reporting rate in order to report the parameter, wherein the second parameter reporting rate that is greater than the first parameter reporting rate.

3. The system of claim 2, wherein the parameter reporting engine is configured to:
reduce, subsequent to determining that the rate of change of the parameter has exceeded the reporting rate of change and driving the storage device activity light at the second parameter reporting rate in order to report the parameter, the driving of the storage device activity light exponentially from second parameter reporting rate to the first parameter reporting rate.

4. The system of claim 2, wherein the parameter reporting engine is configured to:
drive, in response to determining that the rate of change of the parameter has exceeded a first reporting rate of change, the storage device activity light at the second parameter reporting rate in order to report the parameter, wherein the second parameter reporting rate that is greater than the first parameter reporting rate; and
drive, in response to determining that the rate of change of the parameter has exceeded a second reporting rate of change, the storage device activity light at a third parameter reporting rate in order to report the parameter, wherein the third parameter reporting rate that is greater than the second parameter reporting rate.

5. The system of claim 1, wherein the parameter associated with the storage device is a temperature parameter, and wherein the parameter reporting engine is configured to:
determine whether a first rate of change of the temperature parameter has exceeded a first reporting rate of change that is indicative that the storage device is increasing in temperature.

6. The system of claim 5, wherein the parameter reporting engine is configured to:
determine whether a second rate of change of the temperature parameter has exceeded a second reporting rate of change that is indicative that the storage device is decreasing in temperature.

7. An Information Handling System (IHS), comprising:
a processing system; and
a memory system that is coupled to the processing system and that includes instructions that, when executed by the processing system, cause the processing system to provide a parameter reporting engine that is configured to:
monitor a parameter associated with a component;
determine whether a rate of change of the parameter that includes a change in the parameter over a change in time has exceeded a reporting rate of change; and
drive, in response to determining that the rate of change of the parameter has exceeded the reporting rate of change, a component activity light via at least one activity light parameter reporting signal that is configured to report the parameter.

8. The IHS of claim 7, wherein the parameter reporting engine is configured to:
drive, prior to determining that the rate of change of the parameter has exceeded the reporting rate of change, the component activity light at a first parameter reporting rate in order to report the parameter; and
drive, subsequent to determining that the rate of change of the parameter has exceeded the reporting rate of change, the component activity light at a second parameter reporting rate in order to report the parameter, wherein the second parameter reporting rate that is greater than the first parameter reporting rate.

9. The IHS of claim 8, wherein the parameter reporting engine is configured to:
reduce, subsequent to determining that the rate of change of the parameter has exceeded the reporting rate of change and driving the component activity light at the second parameter reporting rate in order to report the parameter, the driving of the component activity light exponentially from second parameter reporting rate to the first parameter reporting rate.

10. The IHS of claim 8, wherein the parameter reporting engine is configured to:
drive, in response to determining that the rate of change of the parameter has exceeded a first reporting rate of change, the component activity light at the second parameter reporting rate in order to report the parameter, wherein the second parameter reporting rate that is greater than the first parameter reporting rate; and
drive, in response to determining that the rate of change of the parameter has exceeded a second reporting rate of change, the component activity light at a third parameter reporting rate in order to report the parameter, wherein the third parameter reporting rate that is greater than the second parameter reporting rate.

11. The IHS of claim 7, wherein the parameter associated with the component is a temperature parameter, and wherein the parameter reporting engine is configured to:
determine whether a first rate of change of the temperature parameter has exceeded a first reporting rate of change that is indicative that the component is increasing in temperature.

12. The IHS of claim 11, wherein the parameter reporting engine is configured to:
determine whether a second rate of change of the temperature parameter has exceeded a second reporting rate of change that is indicative that the component is decreasing in temperature.

13. The IHS of claim 7, wherein the parameter reporting engine is configured to:
transmit, to a controller that is configured to utilize the report of the parameter, a plurality of component characteristics that are related to the parameter.

14. A method for reporting component parameters using a component activity light, comprising:
monitoring, by a component, a parameter associated with the component;

determining, by the component, whether a rate of change of the parameter that includes a change in the parameter over a change in time has exceeded a reporting rate of change; and driving, by the component in response to determining that the rate of change of the parameter has exceeded the reporting rate of change, a component activity light via at least one activity light parameter reporting signal that is configured to report the parameter.

15. The method of claim 14, further comprising:

driving, by the component prior to determining that the rate of change of the parameter has exceeded the reporting rate of change, the component activity light at a first parameter reporting rate in order to report the parameter; and driving, by the component subsequent to determining that the rate of change of the parameter has exceeded the reporting rate of change, the component activity light at a second parameter reporting rate in order to report the parameter, wherein the second parameter reporting rate that is greater than the first parameter reporting rate.

16. The method of claim 14, further comprising:

reducing, by the component subsequent to determining that the rate of change of the parameter has exceeded the reporting rate of change and driving the component activity light at the second parameter reporting rate in order to report the parameter, the driving of the component activity light exponentially from second parameter reporting rate to the first parameter reporting rate.

17. The method of claim 16, further comprising:

reducing, by the component subsequent to determining that the rate of change of the parameter has exceeded the reporting rate of change and driving the component activity light at the second parameter reporting rate in order to report the parameter, the driving of the component activity light exponentially from second parameter reporting rate to the first parameter reporting rate.

18. The method of claim 14, wherein the parameter associated with the component is a temperature parameter, and wherein the method further comprises:

determining, by the component, whether a first rate of change of the temperature parameter has exceeded a first reporting rate of change that is indicative that the component is increasing in temperature.

19. The method of claim 18, further comprising:

determining, by the component, whether a second rate of change of the temperature parameter has exceeded a second reporting rate of change that is indicative that the component is decreasing in temperature.

20. The method of claim 14, further comprising:

transmitting, by the component to a controller that is configured to utilize the report of the parameter, a plurality of component characteristics that are related to the parameter.

* * * * *